(12) United States Patent
Dray et al.

(10) Patent No.: US 8,331,166 B2
(45) Date of Patent: Dec. 11, 2012

(54) METHOD AND SYSTEM FOR READING FROM MEMORY CELLS IN A MEMORY DEVICE

(75) Inventors: Cyrille Dray, Antibes (FR); Alexandre Ney, Toulouse (FR)

(73) Assignee: Infineon Techn. AG, Neubiberg (DE)

( * ) Notice: Subject to any disclaimer, the term of this patent is extended or adjusted under 35 U.S.C. 154(b) by 125 days.

(21) Appl. No.: 13/036,030

(22) Filed: Feb. 28, 2011

(65) Prior Publication Data

US 2012/0218830 A1    Aug. 30, 2012

(51) Int. Cl.
  *G11C 5/14*    (2006.01)
(52) U.S. Cl. ......... 365/189.09; 365/185.12; 365/230.03; 365/230.08
(58) Field of Classification Search ............. 365/189.09, 365/185.12, 230.06, 230.08
  See application file for complete search history.

(56) References Cited

U.S. PATENT DOCUMENTS

| | | | |
|---|---|---|---|
| 6,269,040 | B1 | 7/2001 | Reohr et al. |
| 6,580,298 | B1 | 6/2003 | Subramanian et al. |
| 6,711,068 | B2 | 3/2004 | Lin et al. |
| 7,292,484 | B1 | 11/2007 | Andre et al. |
| 7,457,143 | B2 | 11/2008 | Lehmann et al. |
| 2004/0240283 | A1* | 12/2004 | Tellier ............ 365/200 |

OTHER PUBLICATIONS

Thomas W. Andre et al., A 4-Mb 0.18-μm 1T1MTJ Toggle MRAM With Balanced Three input Sensing Scheme and Locally Mirrored Unidirectional Write Drivers, IEEE Journal of Solid-State circuits, vol. 40, No. 1, Jan. 2005, pp. 301-309.

* cited by examiner

Primary Examiner — Jason Lappas
(74) Attorney, Agent, or Firm — Infineon Techn AG Patent Department

(57) ABSTRACT

A method and a system for reading from memory cells in a memory device are provided. In one embodiment, the memory device comprises a first plurality of data lines and a second plurality of data lines, at least one first multiplexer coupled to the first plurality of data lines and at least one low reference line, at least one second multiplexer coupled to the second plurality of data lines and at least one high reference line, at least one third multiplexer coupled to the at least one first multiplexer and the at least one second multiplexer, and a reference memory cell coupled to the at least one third multiplexer and at least one sense amplifier.

20 Claims, 4 Drawing Sheets

METHOD AND SYSTEM FOR READING FROM MEMORY CELLS IN A MEMORY DEVICE

TECHNICAL FIELD

The present invention relates generally to a memory device. In particular, the present disclosure relates to a method and system for reading from memory cells in a memory device.

BACKGROUND

Reference memory cells in memory devices are used for sensing the state of a memory cell having at least two memory states. A reference memory cell is part of a reference line. Many reference memory cells currently comprise additional lines, refer to as shield lines, to protect reference lines against cross-talk. The shield lines however add area to the memory device. Therefore, a need exists for a method and system for reading from memory cells without the need for shield lines and saves area.

SUMMARY OF INVENTION

The present disclosure provides a method and system for reading from memory cells in a memory device. In one embodiment, the memory device comprises a first plurality of data lines and a second plurality of data lines, at least one first multiplexer coupled to the first plurality of data lines and at least one low reference line, at least one second multiplexer coupled to the second plurality of data lines and at least one high reference line, at least one third multiplexer coupled to the at least one first multiplexer and the at least one second multiplexer, and a reference memory cell coupled to the at least one third multiplexer and at least one sense amplifier.

Alternatively, the method comprises providing a first plurality of data lines with at least one low reference line and a second plurality of data lines with at least one high reference line, selecting a low reference line from the at least one low reference line and selecting a high reference line from the at least one high reference line, selecting at least one first data line from the first plurality of data lines and at least one second data line from the second plurality of data lines, and sending the low reference line, the high reference line, the at least one first data line and at least one second data line to at least one sense amplifier.

Yet still in another alternative embodiment, the method comprises selecting by at least one first multiplexer at least one low reference line, selecting by at least one second multiplexer at least one high reference line, and sending by a reference memory cell the at least one reference line and at least one high reference line to at least one sense amplifier.

DETAILED DESCRIPTION

It is to be understood that the features of the various exemplary embodiments described herein may be combined with each other, unless specifically noted otherwise.

The present disclosure relates to memory devices having local reference memory cells for reading such as ROMs, MRAMs, PCRAM, and the like.

Figure 1:
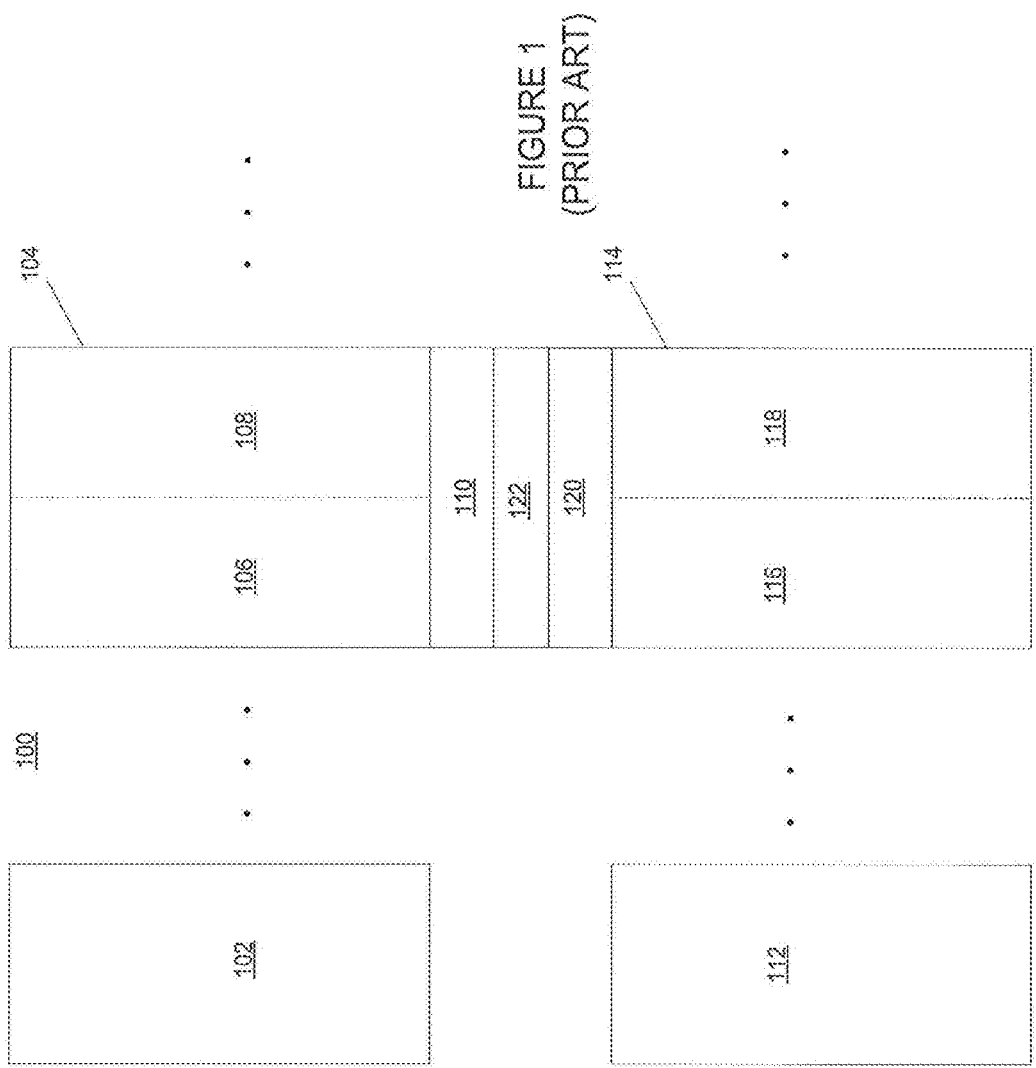
FIG. 1 is a diagram illustrating an exemplary memory device in accordance with prior art.

Referring to FIG. 1, a diagram illustrating an exemplary memory device is depicted in accordance with prior art. Memory device 100 comprises row decoder 102 for decoding memory addresses to select rows associated with a memory sub-array. Memory device 100 may comprise a plurality of sub-arrays. For example, a sub-array 104 having a first sub-array 106 for the left portion and a second sub-array 108 for the right portion. A column decoder 110 is connected to sub-array 104 for decoding memory addresses in order to select data from a predetermined column within a sub-array 104.

Similarly, memory device 100 further comprises a row decoder 112 for decoding memory addresses to select a row associated with sub-array 114. Sub-array 114 comprises a first sub-array 116 for the left portion and a second sub-array 118 for the right portion. A column decoder 120 is connected to sub-array 114 for decoding memory addresses to select data from a predetermined column within a sub-array 114.

In memory devices such as memory device 100, sense amplifier 122 is used to sense the state of the memory with at least two distinct resistance states. The sense amplifier 122 determines a data value based on the selected row and column within each sub-array and generates an output value for the bit being addressed.

Figure 2:
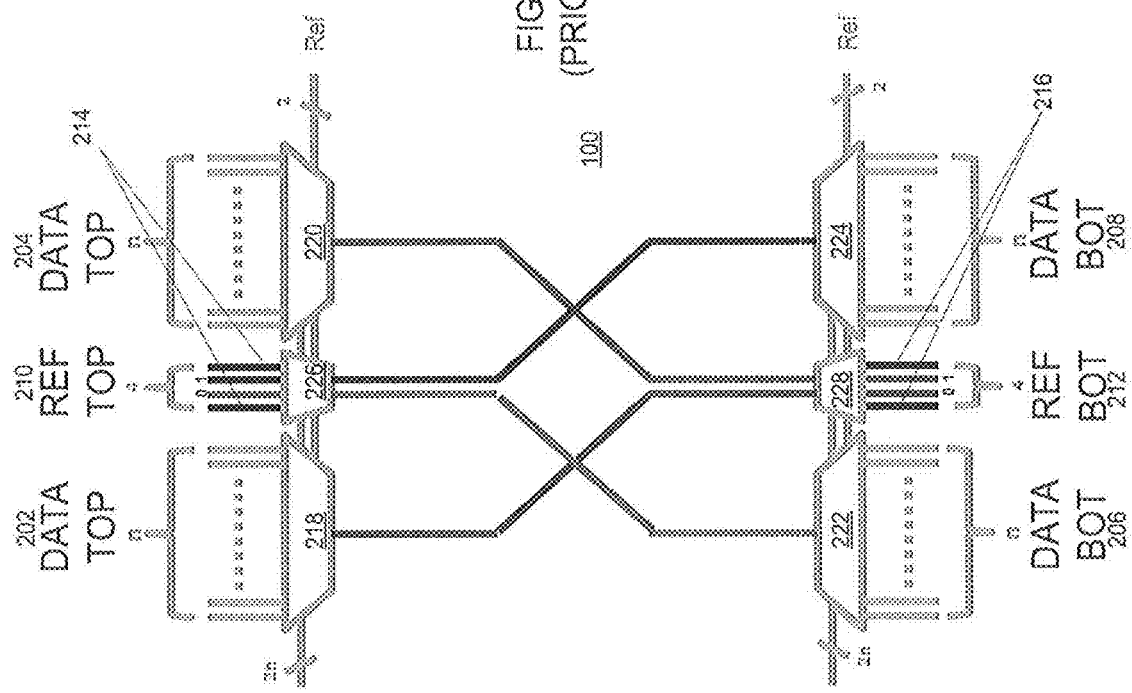
FIG. 2 is a diagram illustrating an exemplary memory device for reading from memory cells in a memory device in accordance with prior art.

Referring to FIG. 2, a diagram illustrating an exemplary memory device for reading from memory cells is depicted in accordance with prior art. In this example, memory device 100 comprises first top portion data lines 202 and second top portion data lines 204. The first and second top portion data lines 202 and 204 may have a size of n bits. For example, first and second top portion data lines 202 and 204 may each be 16 bits wide. Thus, first top portion data lines 202 may comprise bit 0 to bit 15 and the second top portion data lines 204 may comprise bit 16 to bit 31. Similarly, memory device 100 may comprise first bottom portion data lines 206 and second bottom portion data lines 208. The first and second bottom portion data lines 206 and 208 may also have a size of n bits. For example, first and second bottom portion data lines 206 and 208 may each be 16 bits wide. The selection of data lines from top portions 202, 204 may be performed by multiplexers 218, 220. The selection of data lines from bottom portions 206, 208 may be performed by multiplexers 222, 224.

Memory device 100 further comprises top portion reference lines 210 and bottom portion reference lines 212. In this example, both top portion reference lines 210 and bottom portion reference lines 212 comprise two bits, a low reference line (bit 0) and a high reference line (bit 1). The selection of top portion and bottom portion reference lines 210, 212 may be performed by multiplexers 226, 228. To avoid cross talks between the reference lines and data lines, shield lines 214 and 216 are provided to shield top portion reference lines 210 and bottom portion reference lines 212 from first and second top portion data lines 202, 204 and first and second bottom portion data lines 206, 208. Shield lines 214 and 216, however, add memory area to memory device 100.

As discussed previously, sense amplifier 122 may determine a data value based on the selected row and column within each sub-array and generates an output value. For example, sense amplifier may compare an average signal derived from a high reference line and a low reference line with a data line and generates a data output. Thus, each data output requires a pair of reference lines, which increases memory area and power consumption.

In operation, each of the data lines is connected to a predetermined sub-array column and each column relates to either a top portion or bottom portion sub-array. Further, the top and bottom portion sub-array each has a left and a right portion. Thus, first top portion data lines 202 form top left portion data lines and second top portion data lines 204 form top right portion data lines.

The data lines in the top left portion 202 and the top right portion 204 share a common set of high and low reference lines. The high and low reference lines in the top portion reference lines 210 are connected to common sensing rails in the bottom portion sub-array. For example, the high reference line (bit 1) is connected to right bottom portion data lines 208 while the low reference line (bit 0) is connected to the bottom left portion data lines 206.

The data lines in the bottom left portion 206 and the bottom right portion 208 share a common set of high and low reference lines. The high and low reference lines in the bottom portion reference lines 212 are connected to common sensing rails in the top portion sub-array. For example, the high reference line (bit 1) is connected to top right portion data lines 204 while the low reference line (bit 0) is connected to the top left portion data lines 202.

Only one of either top portion or bottom portion is accessed for any particular read operation. If the top portion is accessed for a particular column on the left, data from that particular column is placed on the sensing rail. A control signal enables the low reference line in the top left portion and the high reference line in the top right portion. Data from the high reference line and low reference line are also placed on the sensing rail as inputs to the sense amplifier. Thus, for each data output, two times n bit data lines with two reference lines are necessary to generate the single data output. However, two shield lines are required to shield the two times n bit data lines from the two reference lines. In this memory architecture, the reference and data lines are balanced.

To avoid the added area caused by the shield lines 214, 216 of top portion reference lines 210 and bottom portion reference lines 212, the present disclosure provides a memory architecture that merges reference lines and data lines together and routes the data and reference lines through an interconnection network within the memory architecture.

Figure 3:
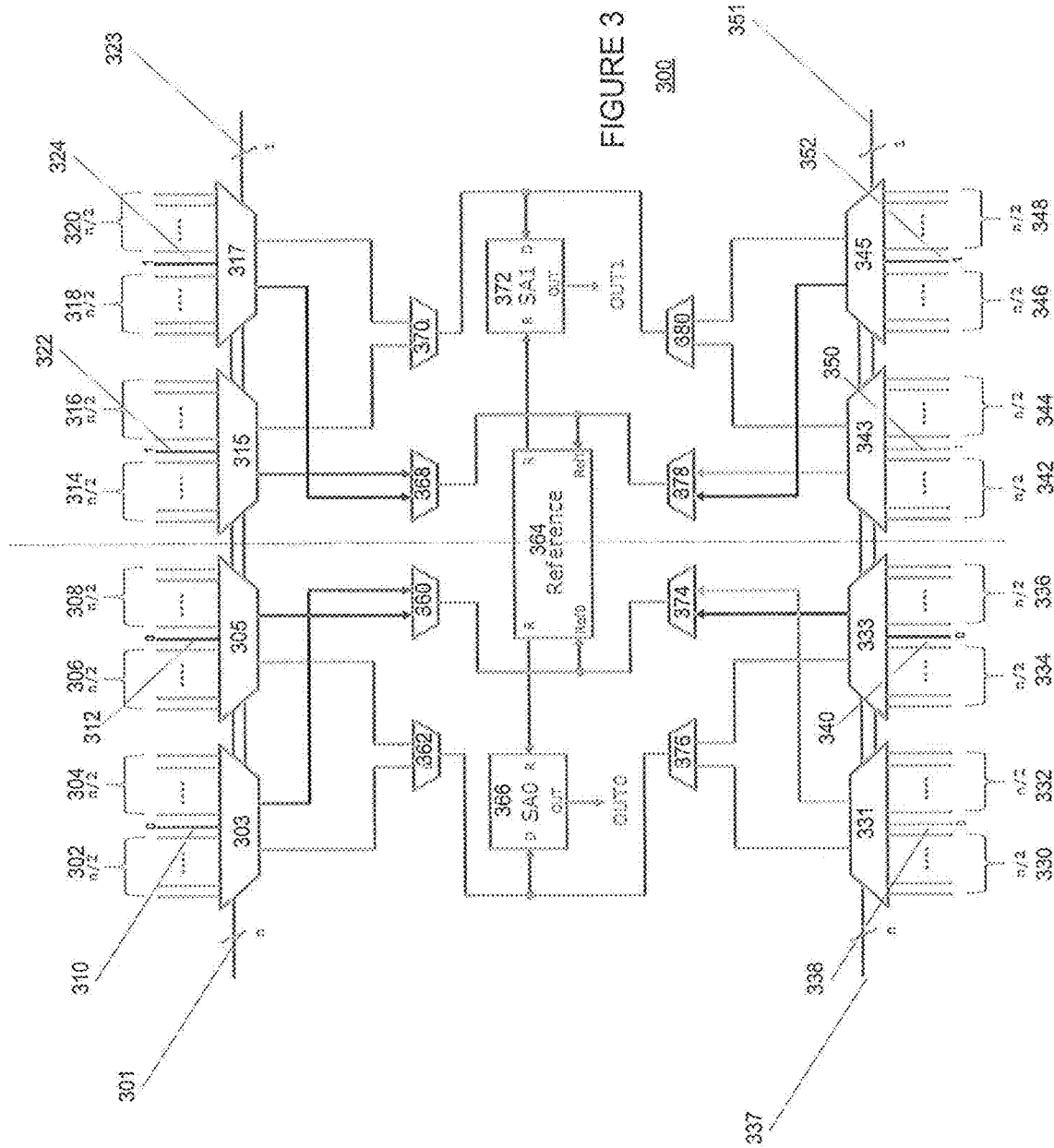
FIG. 3 is a diagram illustrating an exemplary memory device for reading from memory cells in a memory device in accordance with one embodiment of the present disclosure.

Referring to FIG. 3, a diagram illustrating an exemplary memory device for reading from memory cells is depicted in accordance with one embodiment of the present disclosure. Unlike memory device 100 in FIG. 2, memory device 300 comprises top left portion data lines 202 being divided into four top portion data lines each having n/2 bits, top left portion data lines 302, 304, 306, and 308. Instead of sharing the low reference line (bit 0) of the bottom portion reference lines 212, the low reference line (bit 0) is merged with top left portion data lines. For example, low reference line 310 is merged with top left portion data lines 302 and 304 while low reference line 312 is merged with top left portion data lines 306 and 308. In this way, shield lines 214 are eliminated and memory area may be saved. The selection of the top left portion data lines 302, 304, 306, 308 and low reference lines 310, 312 is based on a one bit reference control signal 323 and n-bit data control signal 301.

Similarly, top right portion data lines 204 from FIG. 2 are divided into four top portion data lines each having n/2 bits, top right portion data lines 314, 316, 318, and 320. Instead of sharing the high reference line (bit 1) of the bottom portion reference lines 212, the high reference line (bit 1) is merged with top right portion data lines. For example, high reference line 322 is merged with top right portion data lines 314 and 316 while high reference line 324 is merged with top right portion data lines 318 and 320. In this way, shield lines 214 are eliminated and memory area may be saved. The selection of the top right portion data lines 314, 316, 318, 320 and high reference lines 322, 324 is based on a one bit reference control signal 323 and n-bit data control signal 301.

Also shown in FIG. 3, bottom left portion data lines 206 from FIG. 2 are divided into four bottom portion data lines each having n/2 bits, bottom left portion data lines 330, 332, 334, and 336. Instead of sharing the low reference line (bit 0) of the top portion reference lines 210, the low reference line (bit 0) is merged with bottom left portion data lines. For example, low reference line 338 is merged with bottom left portion data lines 330 and 332 while low reference line 340 is merged with bottom left portion data lines 334 and 336. In this way, shield lines 216 are eliminated and memory area may be saved. The selection of the bottom left portion data lines 330, 332, 334, and 336 and low reference lines 338, 340 is based on a one bit reference control signal 351 and n-bit data control signal 337.

Similarly, bottom right portion data lines 204 from FIG. 2 are divided into four top portion data lines each having n/2 bits, bottom right portion data lines 342, 344, 346, and 348. Instead of sharing the high reference line (bit 1) of the top portion reference lines 210, the high reference line (bit 1) is merged with bottom right portion data lines. For example, high reference line 350 is merged with bottom right portion data lines 342 and 344 while high reference line 352 is merged with bottom right portion data lines 346 and 348. In this way, shield lines 216 are eliminated and memory area may be saved. The selection of the bottom right portion data lines 342, 344, 346, and 348 and high reference lines 350, 352 is based on a one bit reference control signal 351 and n-bit data control signal 337.

In operation, if the top portion is accessed, a low reference line is selected from one of the low reference lines that are merged with top left portion data lines. In one embodiment, a low reference line is selected from top left portion data lines that are not accessed. In this way, cross talk between data and reference lines are avoided. In addition, the outputs of the multiplexers are shorted to balance reference and data line capacitance. Therefore, only one signal, data or reference signal, should be read from the multiplexers. For example, if data line from top left portion data lines 302 is selected, multiplexer 360 selects low reference line 312 from among top left portion data lines 306, 308 that is not being accessed. If data line from top left portion data lines 306 is selected, multiplexer 360 selects low reference line 310 from among top left portion data lines 302, 304 that is not being accessed.

To select low reference line 312 from among top left portion data lines 306, 308, a one-bit reference control signal Ref 323 is sent to multiplexer 305. On the other hand, if top left portion data lines 306, 308 are selected, an n-bit data control signal 301 is sent to multiplexer 305 to select the data lines instead. Similarly, to select low reference line 310 from among top left portion data lines 302, 304, a one-bit reference line control signal Ref 323 is sent to multiplexer 303. On the other hand, if top left portion data lines 302, 304 are selected, an n-bit data control signal 301 is sent to multiplexer 303 to select the data lines instead.

The selected low reference line 310 or 312 is then sent by multiplexer 360 to reference signal generation unit 364 as input Ref0. In the context of the present disclosure, reference signal generation unit 364 elaborates input R to sense amplifiers 366 and 372 from input reference signals ref0 and ref1 and resolves them as a midpoint reference, for example.

Similarly, a high reference line is selected from one of the high reference lines that are merged with top right portion data lines. In one embodiment, a high reference line is selected from top right portion data lines that are not accessed. In this way, cross talk between data and reference lines are avoided. In addition, the outputs of the multiplexers are shorted to balance reference and data line capacitance. Therefore, only one signal, data or reference signal, should be read from the multiplexers. For example, if data line from top right portion data lines 318 is selected, multiplexer 368 selects high reference line 322 from among top right portion data lines 314, 316 that is not being accessed. If data line from top right portion data lines 314 is selected, multiplexer 368 selects high reference line 324 from among top right portion data lines 318, 320 that is not being accessed.

To select high reference line 322 from among top right portion data lines 314, 316, a one-bit reference control signal Ref 323 is sent to multiplexer 315. On the other hand, if top right portion data lines 314, 316 are selected, an n-bit data control signal 301 is sent to multiplexer 315 to select the data lines instead. Similarly, to select high reference line 324 from among top right portion data lines 318, 320, a one-bit reference line control signal Ref 323 is sent to multiplexer 317. On the other hand, if top right portion data lines 318, 320 are selected, an n-bit data control signal 301 is sent to multiplexer 317 to select the data lines instead.

The selected high reference line 322 or 324 is sent by multiplexer 368 to reference signal generation unit 364 as input Ref1. In the context of the present disclosure, reference signal generation unit 364 elaborates input R to sense amplifiers 366 and 372 from input reference signals ref0 and ref1 and resolves them as a midpoint reference, for example.

Reference signal generation unit 364 receives low reference line 310 or 312 at Ref0 and high reference line 322 or 324 at Ref1 and places a combination of both reference lines as, for example, a midpoint reference on the sensing rail as input R to sense amplifiers 366, 372. Sense amplifiers 366, 372 also receive data line selected by multiplexers 362, 370 from top left portion data lines 302, 304, 306, and 308 and top right portion data lines 314, 316, 318, and 320 to generate outputs OUT0, OUT1.

Alternatively, if the bottom portion is accessed, a low reference line is selected from one of the low reference lines that are merged with bottom left portion data lines. In one embodiment, a low reference line is selected from bottom left portion data lines that are not accessed. In this way, cross talk between data and reference lines are avoided. In addition, the outputs of the multiplexers are shorted to balance reference and data line capacitance. Therefore, only one signal, data or reference signal, should be read from the multiplexers. For example, if data line from bottom left portion data lines 330 is selected, multiplexer 374 selects low reference line 340 from among bottom left portion data lines 334, 336 that is not being accessed.

If data line from bottom left portion data lines 334 is selected, multiplexer 374 selects low reference line 338 from among bottom left portion data lines 330, 332 that is not being accessed. The selected low reference line 338 or 340 is sent by multiplexer 374 to reference signal generation unit 364 as input Ref0. In the context of the present disclosure, reference signal generation unit 364 elaborates input R to sense amplifiers 366 and 372 from input reference signals ref0 and ref1 and resolves them as a midpoint reference, for example.

Similarly, a high reference line is selected from one of the high reference lines that are merged with bottom right portion data lines. In one embodiment, a high reference line is selected from bottom right portion data lines that are not accessed. In this way, cross talk between data and reference lines are avoided. In addition, the outputs of the multiplexers are shorted to balance reference and data line capacitance. Therefore, only one signal, data or reference signal, should be read from the multiplexers. For example, if data line from bottom right portion data lines 346 is selected, multiplexer 378 selects high reference line 350 from among bottom right portion data lines 342, 344 that is not being accessed. If data line from bottom right portion data lines 344 is selected, multiplexer 378 selects high reference line 352 from among bottom right portion data lines 346, 348 that is not being accessed. The selected high reference line 350 or 352 is sent by multiplexer 378 to reference signal generation unit 364 as input Ref1. In the context of the present disclosure, reference signal generation unit 364 elaborates input R to sense amplifiers 366 and 372 from input reference signals ref0 and ref1 and resolves them as a midpoint reference, for example.

Reference signal generation unit 364 receives low reference line 338 or 340 at Ref0 and high reference line 350 or 352 at Ref1 and places a combination of both reference lines as, for example, a midpoint reference on the sensing rail as input R to sense amplifiers 366, 372. Sense amplifiers 366, 372 also receive data line selected by multiplexers 376, 380 from bottom left portion data lines 330, 332, 334, and 336 and bottom right portion data lines 342, 344, 346, and 348 to generate outputs OUT0, OUT1.

In this memory architecture, four times n bit data lines and four reference lines are necessary to generate two data output values. However, no shield line is required because the reference lines are merged with the data lines. Thus, four shield lines are eliminated for every two output data bit. Much like the memory device in FIG. 2, the reference lines and data lines of memory device 300 are also balanced.

Figure 4:
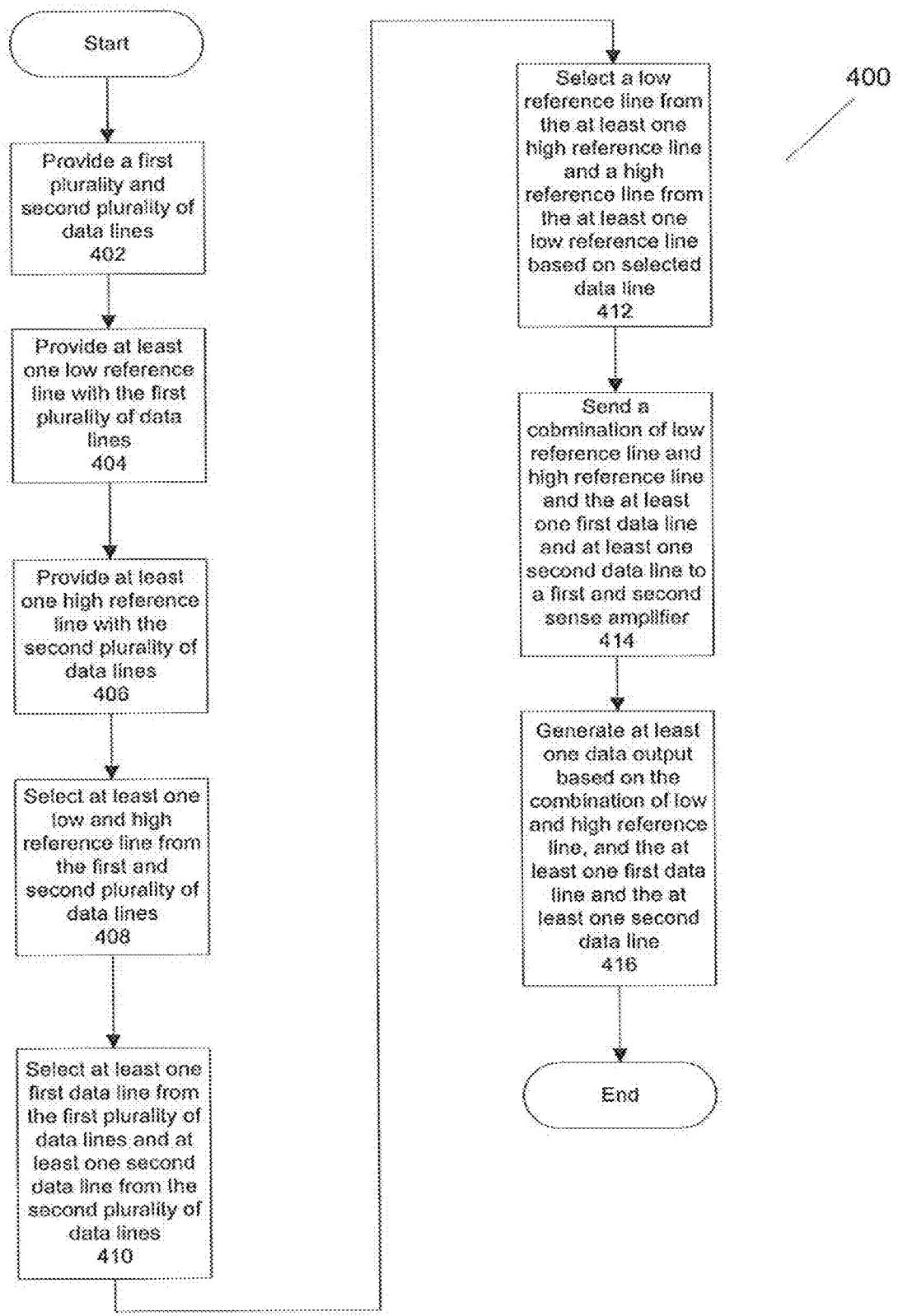
FIG. 4 is a flowchart of an exemplary process for reading from memory cells in a memory device in accordance with one embodiment of the present disclosure.

Referring to FIG. 4, a flowchart of an exemplary process for reading from memory cells in a memory device is depicted in accordance with one embodiment of the present disclosure. Process 400 may be computer programmable instructions programmed to be executed in a memory device, such as memory device 300 in FIG. 3. Process 400 begins at step 402 to provide a first plurality of data lines and second plurality of data lines. For example, a first plurality of data lines 302, 304, 306, 308 and a second plurality of data lines 314, 316, 318, 320 may be provided.

Next, process 400 continues to step 404 to provide at least one low reference line with the first plurality of data lines. For example, low reference lines 310 and 312 are provided with the first plurality of data lines 302, 304, 306, 308. Process 400 then continues to step 406 to provide at least one high reference line with the second plurality of data lines. For example, high reference lines 322 and 324 are provided with the first plurality of data lines 314, 316, 318, 320.

Process 400 then continues to step 408 to select at least one low reference line from the first plurality of data lines and at least one high reference line from the second plurality of data lines. For example, low reference lines 310 and 312 are selected from among the first plurality of data lines 302, 304, 306, 308 by multiplexers 303, 305 while high reference lines 322 and 324 are selected from among the second plurality of data lines 314, 316, 318, 320 by multiplexers 315, 317. The selection of low or high reference lines from among the first and second plurality of data lines may be performed by multiplexers based on a control signal, such as a one bit reference control signal 323, 351 or an n-bit data control signal 301, 337.

Process 400 then continues to step 410 to select at least one first data line from the first plurality of data lines and at least one second data line from the second plurality of data lines. For example, at least one first data line 302 is selected from the first plurality of data lines 302, 304, 306, 308 by multiplexer 362 and at least one second data line 314 is selected from the second plurality of data lines 314, 316, 318, 320 by multiplexer 370.

Process 400 then continues to step 412 to select a low reference line from the at least one low reference line and a high reference line from the at least one high reference line based on the data line selected in step 410. For example, low reference line 310 is selected by multiplexer 360 from at least one low reference line 310 and 312 if data lines 306, 308 are being selected. High reference line 322 is selected by multiplexer 368 from at least one high reference line 322 and 324 if data lines 318, 320 are selected.

Process 400 then continues to step 414 to send a combination of the low reference line and the high reference line (input R) as selected in step 412, and the at least one first data line and at least one second data line to a first and a second sense amplifier. For example, if data lines 306, 308, 318, 320 are selected, reference signal generation unit 364 sends a combination of the low reference line 310 and the high reference line 322 (input R) as a midpoint reference to first sense amplifier 366 and the second sense amplifier 372 respectively. Multiplexer 362 sends the at least one first data line 306, 308 to first sense amplifier 366 and multiplexer 370 sends at least one second data line 318, 320 to second sense amplifier 372.

On the other hand, if data lines 302, 304, 314, 316 are selected, reference signal generation unit 364 sends a combination of the low reference line 312 and high reference line 324 (input R) as a midpoint reference to first sense amplifier 366 and second sense amplifier 372 respectively. Multiplexer 362 sends at least one first data lines 302, 304 to the first sense amplifier 366 and multiplexer 370 sends the at least one second data line 314, 316 to second sense amplifier 372.

Process 400 then completes at step 416 to generate at least one data output based on the combination of the low reference line and the high reference line (input R), and the at least one first data line and the at least one second data line. For example, sense amplifiers 366 and 372 generate output data OUT0 and OUT1 based on the combination of low reference line 310 and high reference line 322 (input R) and at least one first data line 306, 308 and at least one second data line 318, 320. Alternatively, sense amplifier 366 and 372 may generate output data OUT0 and OUT1 based on the combination of high reference line 324 and low reference line 312 (input R), and at least one first data line 302, 304 and at least one second data line 314, 316.

Thus, the present disclosure provides a system and method for reading from reference memory cells without the need for shield lines by merging the reference lines and the data lines. This memory architecture saves memory area occupied by shield lines and provides a more efficient routing of data and reference lines through its interconnection network.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed:

1. A memory device comprising:
   a first plurality of data lines and a second plurality of data lines;
   at least one first multiplexer coupled to the first plurality of data lines and at least one low reference line;
   at least one second multiplexer coupled to the second plurality of data lines and at least one high reference line;
   at least one third multiplexer coupled to the at least one first multiplexer and the at least one second multiplexer; and
   a reference signal generation unit coupled to the at least one third multiplexer and at least one sense amplifier.

2. The device of claim 1, wherein the at least one first multiplexer comprises a first multiplexer coupled to a first set of data lines of the first plurality of data lines and a second multiplexer coupled to a second set of data lines of the first plurality of data lines.

3. The device of claim 2, wherein the first plurality of data lines comprise a predetermined number of data bits and wherein the first set of data lines and second set of data lines each comprise half of the predetermined number of data bits.

4. The device of claim 2, wherein the at least one second multiplexer comprises a third multiplexer coupled to the first set of data lines of the second plurality of data line and a fourth multiplexer coupled to a second set of data lines of the second plurality of data lines.

5. The device of claim 4, wherein the second plurality of data lines comprise a predetermined number of data bits and the first set of data lines and the second set of data lines each comprise half of the predetermined number of data bits.

6. The device of claim 4, wherein the at least one low reference line comprises a first low reference line provided with the first set of data lines of the first plurality of data lines and a second low reference line provided with the second set of data lines of the first plurality of data lines.

7. The device of claim 6, wherein the at least high reference line comprises a first high reference line provided with the first set of data lines of the second plurality of data lines and a second high reference line provided with the second set of data lines of the second plurality of data lines.

8. The device of claim 1, further comprising:
at least one fourth multiplexer coupled to the at least one first multiplexer and the at least one second multiplexer and the at least one sense amplifier.

9. The device of claim 1, wherein the first plurality of data lines and the second plurality of data lines comprise at least one of a plurality of top portion data lines or a plurality of bottom portion data lines.

10. A method for reading from memory cells comprising:
providing at least one low reference line with a first plurality of data lines and at least one high reference line with a second plurality of data lines;
selecting at least one first data line from the first plurality of data lines and at least one second data line from the second plurality of data lines;
selecting a low reference line from the at least one low reference line based on selected at least one first data line and selecting a high reference line from the at least one high reference line based on selected at least one second data line; and
sending a combination of the low reference line and the high reference line, and the selected at least one first data line and the selected at least one second data line to at least one sense amplifier.

11. The method of claim 10, wherein providing at least one low reference line with a first plurality of data lines comprises:
dividing a predetermined number of bits in the first plurality of data lines into half of the predetermined number of bits; and
providing the at least one low reference between the half of the predetermined number of bits.

12. The method of claim 11, wherein providing at least one high reference line with a second plurality of data lines comprises:
dividing a predetermined number of bits in the second plurality of data lines into half of the predetermined number of bits; and
providing the at least one high reference between the half of the predetermined number of bits.

13. The method of claim 10, wherein selecting a low reference line from the at least one low reference line based on selected at least one first data line and selecting a high reference line from the at least one high reference line based on selected at least one second data line comprises:
selecting at least one low reference line from among the first plurality of data lines by at least one first multiplexer based on a reference control signal or a data control signal; and
selecting at least one high reference line from among the second plurality of data lines by at least one second multiplexer based on a reference control signal or a data control signal.

14. The method of claim 13, further comprising:
selecting a low reference line from at least one reference line that is not provided with the selected at least one first data line by at least one third multiplexer; and
selecting a high reference line from the at least one high reference line that is not provided with the selected at least one second data line by at least one fourth multiplexer.

15. The method of claim 10, wherein sending a combination of the low reference line and the high reference line, and the selected at least one first data line and the selected at least one second data line to at least one sense amplifier comprises:
sending, by a reference signal generation unit, the combination of the low reference line and the high reference line as a midpoint reference input (input R), the selected at least one first data line and the selected at least one second data line to a first sense amplifier, and
the selected at least one first data line and the selected at least one second data line to a second sense amplifier.

16. The method of claim 10, further comprising:
generating, by the at least one sense amplifier, at least one data output based on the combination of the low reference line and the high reference line (input R), and the selected at least one first data line and the selected at least one second data line.

17. The method of claim 16, wherein generating, by the at least one sense amplifier, at least one data output based on the combination of the low reference line and the high reference line (input R), and the selected at least one first data line and the selected at least one second data line comprises:
generating a first data output based on the combination of the low reference line and the high reference line (input R), and the selected at least one first data line and the selected at least one second data line by a first sense amplifier; and
generating a second data output based on the combination of the low reference line and the high reference line (input R) and the selected at least one first data line and the selected at least one second data line by a second sense amplifier.

18. A method for reading from memory cells comprising:
selecting, by at least one first multiplexer, at least one low reference line from among a first plurality of data lines;
selecting, by at least one second multiplexer, at least one high reference line from among a second plurality of data lines; and
sending, by a reference signal generation unit, a combination of the at least one low reference line and at least one high reference line to at least one sense amplifier.

19. The method of claim 18, further comprising:
sending, by at least one third multiplexer, at least one of the first plurality of data lines and at least one of the second plurality of data lines to the at least one sense amplifier;
selecting, by at least one fourth multiplexer, a low reference line from the at least one low reference line based on access of the first and second plurality of data lines; and
selecting, the at least one fourth multiplexer, a high reference line from the at least one high reference line based on access of the first and second plurality of data lines.

20. The method of claim 19, further comprising:
generating at least one data output by the at least one sense amplifier based on a combination of the high reference line and the low reference line, and at least one of the first plurality of data lines and at least one of the second plurality of data lines.

* * * * *